United States Patent
Maehata

(10) Patent No.: US 9,344,110 B2
(45) Date of Patent: May 17, 2016

(54) DELTA-SIGMA MODULATOR AND COMMUNICATION DEVICE

(71) Applicant: SUMITOMO ELECTRIC INDUSTRIES, LTD., Osaka-shi, Osaka (JP)

(72) Inventor: Takashi Maehata, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/768,288

(22) PCT Filed: Feb. 27, 2014

(86) PCT No.: PCT/JP2014/054822
§ 371 (c)(1),
(2) Date: Aug. 17, 2015

(87) PCT Pub. No.: WO2014/133061
PCT Pub. Date: Sep. 4, 2014

(65) Prior Publication Data
US 2016/0013805 A1 Jan. 14, 2016

(30) Foreign Application Priority Data

Feb. 27, 2013 (JP) ................................. 2013-037550

(51) Int. Cl.
*H03M 3/00* (2006.01)
(52) U.S. Cl.
CPC .................... *H03M 3/422* (2013.01)
(58) Field of Classification Search
CPC ..................................................... H03M 3/422
USPC ......................................................... 341/143
See application file for complete search history.

(56) References Cited

U.S. PATENT DOCUMENTS

| 5,345,233 | A | | 9/1994 | Nagata et al. | |
| 5,512,897 | A | * | 4/1996 | Wilson et al. | H03M 3/372 341/123 |

(Continued)

FOREIGN PATENT DOCUMENTS

| JP | H06-13906 A | 1/1994 |
| JP | 2003-234638 A | 8/2003 |
| JP | 2009-545899 A | 12/2009 |

OTHER PUBLICATIONS

Toru Kitayabu, et al., "A Proposal of Transmitter Configuration for Multi-Band Aggregation System," 2009 Nen Tsushim Society Taikai Koen Ronbunshu 1, Sep. 1, 2009, p. 420.

(Continued)

*Primary Examiner* — Lam T Mai
(74) *Attorney, Agent, or Firm* — Drinker Biddle & Reath LLP

(57) ABSTRACT

A delta-sigma modulator capable of outputting an output signal including a plurality of signals having different frequencies. The delta-sigma modulator includes: a plurality of input ports to which a plurality of input signals having different frequencies are inputted, respectively; a plurality of loop filters provided corresponding to the plurality of input ports, respectively; an adder configured to add outputs of the plurality of loop filters; and a quantizer configured to quantize an output of the adder. The plurality of loop filters each receive the input signal inputted to the corresponding input port and a feedback signal of an output of the quantizer. The plurality of loop filters each have a characteristic of stopping noise in the vicinity of a frequency of the input signal inputted to the corresponding input port.

5 Claims, 20 Drawing Sheets

(56) References Cited

U.S. PATENT DOCUMENTS

| | | | | |
|---|---|---|---|---|
| 5,619,202 | A * | 4/1997 | Wilson et al. | H03M 3/372 341/123 |
| 6,563,448 | B1 * | 5/2003 | Fontaine | H03M 3/508 341/143 |
| 7,362,252 | B1 * | 4/2008 | Pai | H03M 3/398 341/143 |
| 7,424,280 | B2 * | 9/2008 | Yu | H03L 7/23 331/1 R |
| 2005/0242978 | A1 * | 11/2005 | Locher et al. | H03M 3/33 341/143 |
| 2010/0045499 | A1 | 2/2010 | Rivoir | |

OTHER PUBLICATIONS

Toru Kitayabu, et al., "Concurrent Dual-Band Transmitter Architecture for Spectrum Aggregation System," Radio and Wireless Symposium (RWS), 2010 IEEE, Jan. 2010, pp. 689-692.

Takashi Maehata, et al., "Concurrent Dual-band 1-bit Digital Transmitter Using Band-Pass Delta-Sigma Modulator," Proceedings of the 8th European Microwave Integrated Circuits Conference, Oct. 2013, pp. 552-555.

Richard Schreier, et al., (Takao Waho & Akira Yasuda as translation supervisors), "Understanding Delta-Sigma Data Converters," Maruzen Co., Ltd. 2007, including concise explanation of relevance.

* cited by examiner (b) NTF$_2$(1.5GHz)

(a) NTF$_1$(800MHz)

DELTA-SIGMA MODULATOR AND COMMUNICATION DEVICE

TECHNICAL FIELD

The present invention relates to delta-sigma modulators and communication devices.

BACKGROUND ART

A delta-sigma modulator is configured to include a loop filter and a quantizer (refer to Non Patent Literature 1). The loop filter is a dual-input system, and an input signal to the delta-sigma modulator is inputted to one of two inputs of the loop filter while an output of the quantizer is fed back to the other input.

An output of the loop filter is provided to the quantizer. The quantizer quantizes the output of the loop filter to generate an output signal (quantized signal), and outputs the signal.

CITATION LIST

Non Patent Literature

NON PATENT LITERATURE 1: Takao Waho and Akira Yasuda (translation supervisors) (Original authors: Richard Schreier, Gabor C. Temes), "Understanding Delta-Sigma Data Converters", Maruzen Co., Ltd., 2007

SUMMARY OF INVENTION

Technical Problem

The delta-sigma modulator is useful as a technique for outputting a radio signal by means of only a digital circuit.

The inventor of the present invention has conceived an idea that a delta-sigma modulation scheme is used when communication is performed concurrently using a plurality of bands, such as a concurrent dual band communication. In this case, it is desired to include a plurality of signals of different frequencies in a single output signal outputted from a single delta-sigma modulator.

However, the conventional delta-sigma modulator is merely a single-input single-output system in which a single input signal is subjected to delta-sigma modulation to output a single output signal, and therefore, cannot handle a plurality of input signals.

An object of the present invention is to provide a delta-sigma modulator capable of outputting an output signal including a plurality of signals of different frequencies.

Solution to Problem (1) The present invention from one point of view is a delta-sigma modulator including: a plurality of input ports to which a plurality of input signals having different frequencies are inputted, respectively; a plurality of loop filters provided corresponding to the plurality of input ports, respectively; an adder configured to add outputs of the plurality of loop filters; and a quantizer configured to quantize an output of the adder. The plurality of loop filters are each provided to receive the input signal inputted to the corresponding input port and a feedback signal of an output of the quantizer. The plurality of loop filters each have a characteristic of stopping noise in the vicinity of a frequency of the input signal inputted to the corresponding input port.

Advantageous Effects of Invention

According to the present invention, it is possible to output an output signal including a plurality of signals having different frequencies.

BRIEF DESCRIPTION OF DRAWINGS

FIG. 1 is a block diagram showing a dual band delta-sigma modulator.
FIG. 2 is a block diagram showing a delta-sigma modulator of a CRFB structure.
FIG. 3 is a block diagram showing an equivalent circuit of FIG. 2.
FIG. 4(a) shows positions of Zeros and Poles of $NTF_1$,
and FIG. 4(b) shows positions of Zeros and Poles of $NTF_2$.
FIG. 6 is a diagram showing frequency responses of $STF_1$ and $STF_2$.
FIG. 7 shows a power spectrum obtained by simulating an output of the dual band delta-sigma modulator.
[FIG. 8]
FIG. 8 shows a power spectrum at 800 MHz of the output of the dual band delta-sigma modulator.
FIG. 9 shows a power spectrum at 1.5 GHz of the output of the dual band delta-sigma modulator.
FIG. 10 shows a power spectrum representing a measured result of the output of the dual band delta-sigma modulator.
FIG. 11 is a block diagram of a generalized dual band delta-sigma modulator.
FIG. 12 is a block diagram showing a multi-band delta-sigma modulator.
FIG. 13 shows a power spectrum of an output of the multi-band delta-sigma modulator.
FIG. 14 is a block diagram showing a communication unit according to a first example.
FIG. 15 is a block diagram showing a communication unit according to a second example.
FIG. 16 is a block diagram showing a communication unit according to a third example.
FIG. 17 is a block diagram showing a communication unit according to a fourth example.
FIG. 18 is a block diagram showing a communication unit according to a fifth example.
FIG. 19 shows a power spectrum of an output of a delta-sigma modulator according to the fifth example.
FIG. 20 is a graph showing the magnitudes of run lengths.

DESCRIPTION OF EMBODIMENTS

Hereinafter, preferred embodiments will be described with reference to the drawings.

[1. Outline of Embodiment]

(1) A delta-sigma modulator according to one embodiment includes: a plurality of input ports to which a plurality of input signals having different frequencies are inputted, respectively; a plurality of loop filters provided corresponding to the plurality of input ports, respectively; an adder configured to add outputs of the plurality of loop filters; and a quantizer configured to quantize an output of the adder. The plurality of loop filters are each provided to receive the input signal inputted to the corresponding input port and a feedback signal of an output of the quantizer. The plurality of loop filters each have a characteristic of stopping noise in the vicinity of a frequency of the input signal inputted to the corresponding input port.

According to the above embodiment, the quantizer can output an output signal including a plurality of signals having different frequencies.

(2) Preferably, the plurality of loop filters each include: a differentiator configured to calculate a difference between the input signal inputted to the corresponding input port and the feedback signal of the output of the quantizer; and an inner filter to which an output of the differentiator is inputted.

(3) Preferably, the plurality of loop filters are each provided with a feed forward path configured to add the input signal inputted to the corresponding input port, to an output of the inner filter. In this case, the input signal can be provided to the quantizer side without passing through each loop filter, which makes design of the loop filter easy.

(4) A communication device according to the embodiment includes: the delta-sigma modulator according to one of the above (1) to (3); and one or a plurality of band-pass filters through which an output signal outputted from the quantizer of the delta-sigma modulator passes. The one or the plurality of band-pass filters have passbands which allow the plurality of input signals to the delta-sigma modulator to pass the band-pass filters.

(5) Preferably, the communication device further includes a frequency mixer to which the plurality of input signals having passed through the one or the plurality of band-pass filters are inputted. Preferably, the plurality of input signals to the delta-sigma modulator include a local signal used for frequency conversion by the frequency mixer. In this case, the frequency mixer can perform frequency conversion using the local signal included in the output signal of the delta-sigma modulator.

[2. First Embodiment: Dual Band Delta-sigma Modulator]

Figure 1:
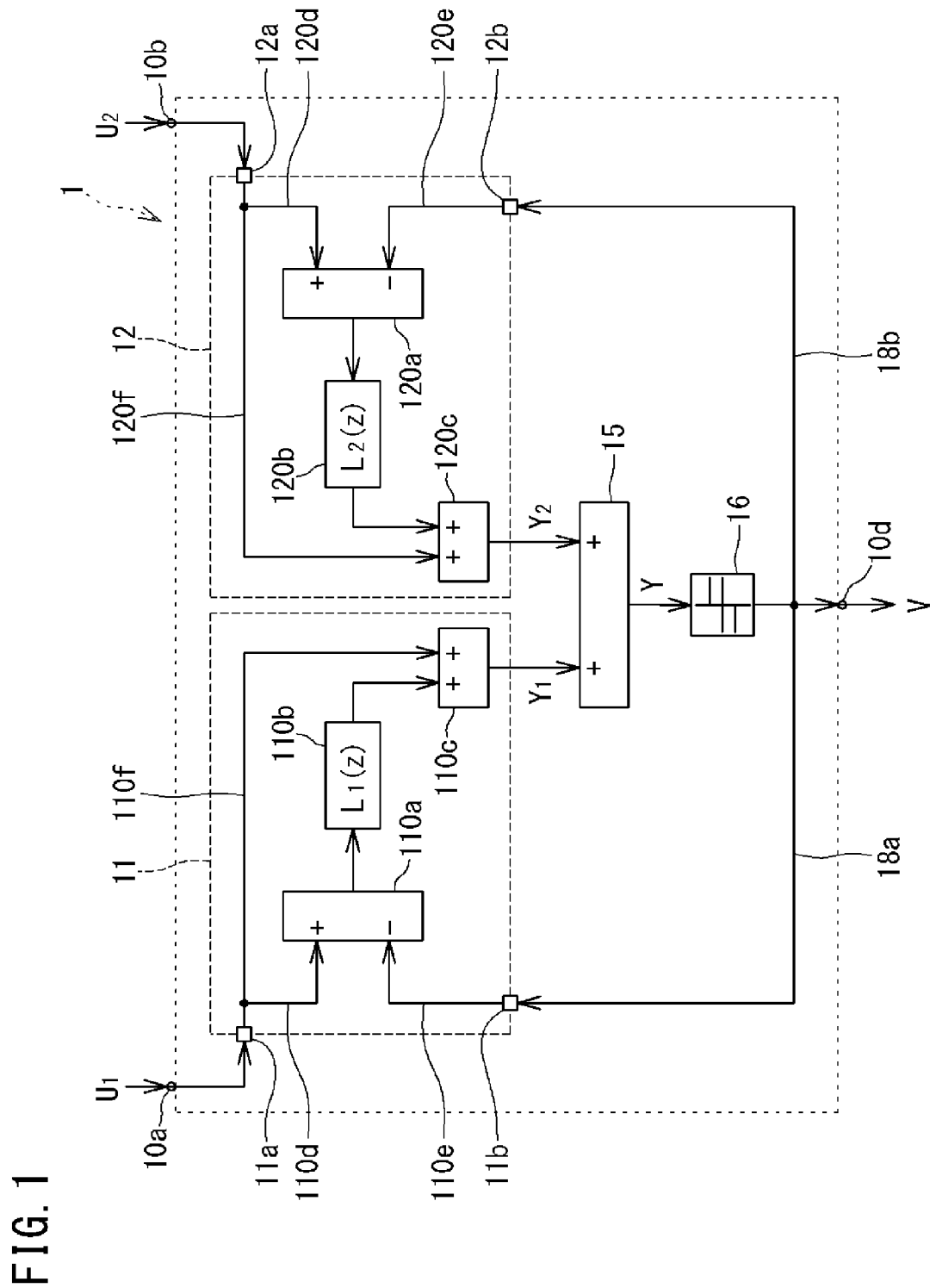
[FIG. 1]

FIG. 1 shows a delta-sigma modulator 1 according to a first embodiment. Two input signals $U_1$, $U_2$ having different frequencies can be inputted to the delta-sigma modulator 1. The delta-sigma modulator 1 includes two input ports (first input port 10a and second input port 10b) to which the two input signals $U_1$, $U_2$ are inputted, respectively, and a single output port 10d.

The output port 10d of the delta-sigma modulator 1 outputs a single output signal (quantized signal; delta-sigma modulated signal) including the two input signals.

The delta-sigma modulator 1 shown in FIG. 1 includes a plurality of loop filters (first loop filter 11 and second loop filter 12), an adder 15, and a quantizer 16.

The number of the loop filters 11, 12 (two in this embodiment) corresponds to the number of the input ports 10a, 10b.

The plurality of loop filters 11, 12 include first input sections 11a, 12a connected to the corresponding input ports 10a, 10b, and second input sections 11b, 12b connected to an output side of the quantizer 16 via feedback paths 18a, 18b, respectively.

To the first input sections 11a, 12a receive the input signals $U_1$, $U_2$ inputted to the corresponding input ports 10a, 10b. The second input sections 11b, 12b receive a feedback signal V of an output V of the quantizer 1.

The plurality of loop filters 11, 12 include differentiators 110a, 120a, respectively. First paths 110d, 120d connected to the first input sections 11a, 12a and second paths 110e, 120e connected to the second input sections 11b, 12b are connected to the differentiators 110a, 120a, respectively. The differentiators 110a, 120a calculate differences $U_1$–V, $U_2$–V between the input signals $U_1$, $U_2$ and the feedback signal V from the quantizer 16, respectively.

The differences $U_1$–V, $U_2$–V calculated by the differentiators 110a, 120a are inputted to inner filters 110b, 120b provided in the loop filters 11, 12, respectively. It is noted that a transfer function of the inner filter 110b of the first loop filter 11 is represented as $L_1(z)$, and a transfer function of the inner filter 120b of the second loop filter 11 is represented as $L_2(z)$.

The outputs $L_1(z)$ ($U_1(z)$–V(z)), $L_2(z)$ ($U_2(z)$–V(z)) from the inner filters 110b, 120b are provided to adders 110c, 120c included in the loop filters 11, 12, respectively.

Feed forward paths 110f, 120f that allow the input signals $U_1$, $U_2$ inputted to the first input sections 11a, 12a to be inputted to the adders 110c, 120c are connected to the adders 110c, 120c, respectively. Therefore, the adders 110c, 120c add the input signals $U_1$, $U_2$, to the outputs $L_1(z)$ ($U_1(z)$–V(z)), $L_2(z)$ ($U_2(z)$–V(z)) of the inner filters 110b, 120b, respectively.

Outputs $Y_1$, $Y_2$ of the adders 110c, 120c (outputs of the loop filters 11, 12) are added to each other by the adder 15. While the three dual-input adders 15, 110c, and 120c are used in this embodiment, one quad-input adder may be used instead of the three dual-input adders 15, 110c, and 120c.

The output Y of the adder 15 is provided to the quantizer 16. The quantizer 16 of this embodiment is a two-level quantizer, and outputs a 1-bit pulse train as a quantized signal (delta-sigma modulated signal) V. The quantized signal V is an output signal of the delta-sigma modulator 1. It is noted that the output signal V is provided to the loop filters 11, 12 via the feedback paths 18a, 18b, respectively.

In order to facilitate understanding of the delta-sigma modulator 1 (multiple-input single-output system) shown in FIG. 1, conventional delta-sigma modulators (single-input single-output system) will be described.

Conventional delta-sigma modulators include a low-pass delta-sigma modulator and a band-pass delta-sigma modulator. The low-pass delta-sigma modulator refers to a delta-sigma modulator in which a center frequency of a quantization noise stop band is at zero frequency, and the band-pass delta-sigma modulator refers to a delta-sigma modulator in which a center frequency of a quantization noise stop band is in a desired frequency band other than zero frequency. A noise transfer function NTF of the band-pass delta-sigma modulator has a characteristic of suppressing quantization noise in the desired frequency band, by use of a band-stop filter.

In the low-pass delta-sigma modulator, zeros of a noise transfer function NTF(z) are positioned near zero frequency (z=1) on a unit circle. In the band-pass delta-sigma modulator, zeros of a noise transfer function NTF are in positions other than zero frequency (z=1) on a unit circle.

Therefore, in order to obtain a band-pass delta-sigma modulator that operates for an input signal in a desired frequency band, the zeros and poles of the noise transfer function NTF of the low-pass delta-sigma modulator may be rotated to the positions, on the unit circle, corresponding to the desired frequency band.

Figure 2:
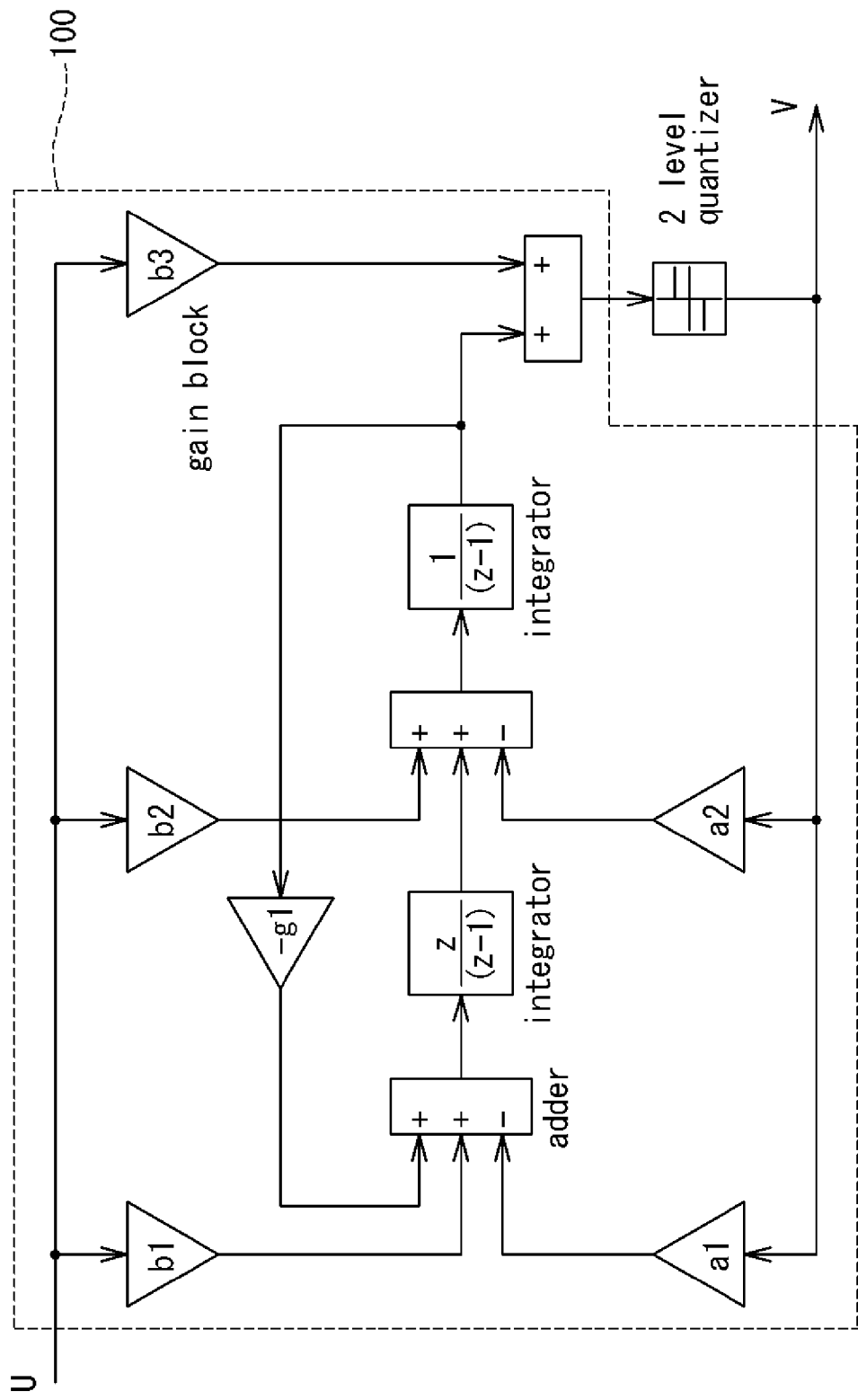
[FIG. 2]

Hereinafter, the low-pass delta-sigma modulator will be described first. FIG. 2 shows a low-pass delta-sigma modulator having a second-order CRFB (cascade of resonators with distributed feedback) structure (refer to Non-Patent Literature 1).

The low-pass delta-sigma modulator having the CRFB structure has a low distortion mode. In the low distortion mode, a1=b1, a2=b2, and b3=1 in FIG. 2, and a signal transfer function STF(z) of the delta-sigma modulator is equal to 1 (STF(z)=1). Therefore, an output V(z) of the delta-sigma modulator shown in FIG. 2 is simplified as expressed by the following equation (1). It is noted that U(z) represents an input to the delta-sigma modulator, and E(z) represents quantization noise of the delta-sigma modulator.

[Math. 1]

$$V(z) = STF(z)U(z) + NTF(z)E(z) = U(z) + NTF(z)E(z) \quad (1)$$

where

[Math. 2]

$$NTF(z) = \frac{z^2 - (2 - g1)z + 1}{z^2 - (2 - a1 - a2 - g1)z + 1 - a2} \quad (2)$$

Figure 3:
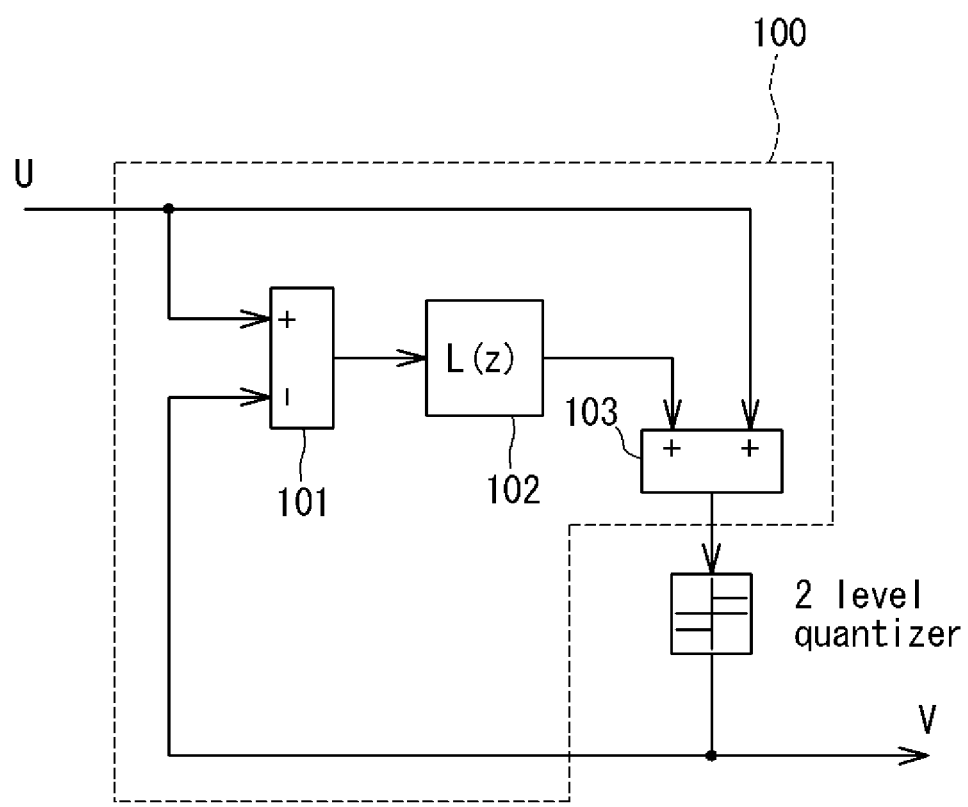
[FIG. 3]

FIG. 3 shows an equivalent circuit of the delta-sigma modulator shown in FIG. 2. Therefore, an output V(z) of a delta-sigma modulator shown in FIG. 3 is also expressed by the above equations (1) and (2).

The delta-sigma modulator shown in FIG. 3 is simplified as compared to the circuit shown in FIG. 2. In the delta-sigma modulator shown in FIG. 3, a differentiator 101 calculates a difference U(z)–V(z) between the input signal U(z) and the output signal V(z), and the difference U(z)–V(z) is provided to a filter 102 represented by a transfer function L(z). An output L(z)(U(z)–V(z)) of the filter 102 is provided to an adder 103. The input signal U(z) is directly inputted to the adder 103.

The transfer function L(z) of the filter 102 shown in FIG. 3 is expressed by use of the noise transfer function NTF(z) of the delta-sigma modulator as shown by the following equation (3). The noise transfer function NTF(z) has a characteristic (band-stop characteristic or high-pass characteristic) of suppressing quantization noise in the frequency band of the input signal of the delta-sigma modulator.

[Math. 3]

$$L(z) = \frac{1}{NTF(z)} - 1 \quad (3)$$

The configuration of each of the loop filters 11, 12 shown in FIG. 1 corresponds to a configuration (a configuration as a loop filter) in a region enclosed by a dashed line and indicated by a reference numeral 100 in FIG. 3.

In other words, the delta-sigma modulator 1 shown in FIG. 1 is obtained by combining a plurality of conventional delta-sigma modulators so as to share a quantizer. It is noted that the combination of the plurality of conventional delta-sigma modulators may be a combination of a plurality of band-pass delta-sigma modulators having different noise stop bands, or a combination of a band-pass delta-sigma modulator and a low-pass delta-sigma modulator.

The filter (inner filter) 110b of the first loop filter 11 corresponding to the filter 102 (transfer function L(z)) shown in FIG. 3 has a transfer function $L_1(z)$ represented by use of a first noise transfer function $NTF_1(z)$. The first noise transfer function $NTF_1(z)$ has a characteristic (band stop characteristic) of suppressing quantization noise in a carrier frequency (first frequency) f1 of a first input signal $U_1(z)$ inputted to the first loop filter 11.

Likewise, the filter (inner filter) 120b of the second loop filter 12 corresponding to the filter 102 (transfer function L(z)) shown in FIG. 3 has a transfer function $L_2(z)$ represented by use of a second noise transfer function $NTF_2(z)$. The second noise transfer function $NTF_2(z)$ has a characteristic (band stop characteristic) of suppressing quantization noise in a carrier frequency (first frequency) f2 of a second input signal $U_2(z)$ inputted to the second loop filter 12.

The output signal V(z) of the delta-sigma modulator 1 shown in FIG. 1 is expressed by the following equation (4). In the equation (4), $STF_1(z)$ represents a first signal transfer function with respect to the first input signal $U_1(z)$, $STF_2(z)$ represents a second signal transfer function with respect to the second input signal $U_2(z)$, and NTF(z) represents a noise transfer function with respect to the entirety of the delta-sigma modulator.

[Math. 4]

$$V(z) = STF1(z)U1(z) + STF2(z)U2(z) + NTF(z)E(z) \quad (4)$$

where

[Math. 5]

$$STF1(z) = \frac{1 + L1(z)}{1 + L1(z) + L2(z)} \quad (5)$$

[Math. 6]

$$STF2(z) = \frac{1 + L2(z)}{1 + L1(z) + L2(z)} \quad (6)$$

[Math. 7]

$$NTF(z) = \frac{1}{1 + L1(z) + L2(z)} \quad (7)$$

[Math. 8]

$$L1(z) = \frac{1}{NTF1(z)} - 1 \quad (8)$$

[Math. 9]

$$L2(z) = \frac{1}{NTF2(z)} - 1 \quad (9)$$

[Math. 10]

$$NTFx(z) = \prod_{i=1}^{M} \frac{z - z_{xi}}{z - p_{xi}}, x = 1, 2 \quad (10)$$

where M is the order of the delta-sigma modulator, $z_{xi}$ is a zero, and $p_{xi}$ is a pole.

Hereinafter, an example will be described in which the first frequency f1 of the first input signal $U_1(z)$ is 800 MHz, and the second frequency f2 of the second input signal $U_2(z)$ is 1.5 GHz. The loop filters 11, 12 each have a six-order (M=6) CRFB structure. A sampling frequency fs of the delta-sigma modulator 1 is 3.9 GHz.

Figure 4:
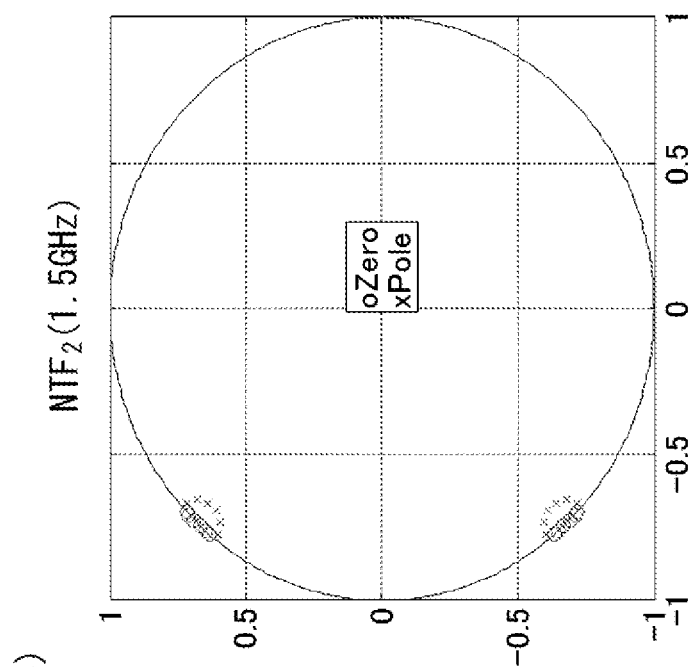
[FIG. 4]
Figure 4:
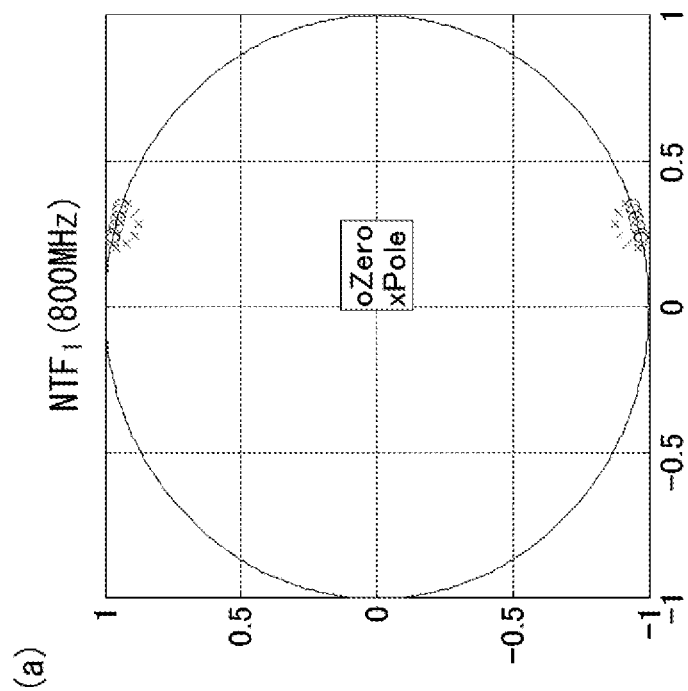

Since the frequency f1 of the first input signal $U_1(z)$ is 800 MHz, the first noise transfer function $NTF_1(z)$ of the first loop filter 11 to which the first input signal $U_1(z)$ is inputted is set so that the center frequency of the noise stop band is about 800 MHz. Specifically, as shown in FIG. 4(a), the center frequency of the noise stop band is set so that zeros $z_{xi}$ and poles $p_{xi}$ are present near 800 MHz (slightly forward of fs/4=about 1 GHz) on the unit circle.

Further, since the frequency f2 of the second input signal $U_2(z)$ is 1.5 GHz, the second noise transfer function $NTF_2(z)$ of the second loop filter 12 to which the second input signal $U_2(z)$ is inputted is set so that the center frequency of the noise stop band is about 1.5 GHz. Specifically, as shown in FIG. 4(b), the center frequency of the noise stop band is set so that zeros $z_{xi}$ and poles $p_{xi}$ are present near 1.5 GHz (between fs/4=about 1 GHz and fs/2=about 2 GHz) on the unit circle.

It is noted that all the variables for determining $NTF_1(z)$, $NTF_2(z)$ are, as shown in the equation (10), determined depending on the zeros $z_{xi}$ and the poles $p_{xi}$ (refer to Non-Patent Literature 1 for optimization of zeros and poles).

Figure 5:
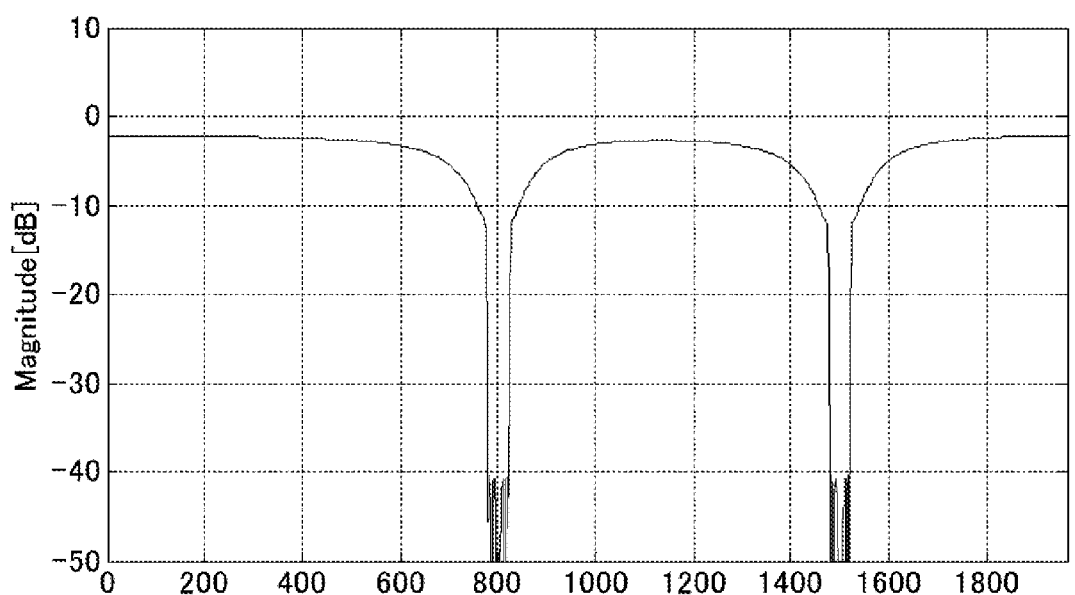
FIG. 5 is a diagram showing a frequency response of NTF.

When the first noise transfer function $NTF_1(z)$ and the second noise transfer function $NTF_2(z)$ have been set as described above, the noise transfer function $NTF(z)$ of the delta-sigma modulator 1 becomes as shown in FIG. 5.

As is apparent from FIG. 5, the noise transfer function $NTF(z)$, in response to two frequencies (dual band) of 800 MHz and 1.5 GHz, has stop bands (notches) in two positions near 800 MHz and near 1.5 GHz.

Therefore, the quantization noise shifts to outside the two stop bands, and thus the quantization noise is suppressed in the two stop bands (noise shaping).

Figure 6:
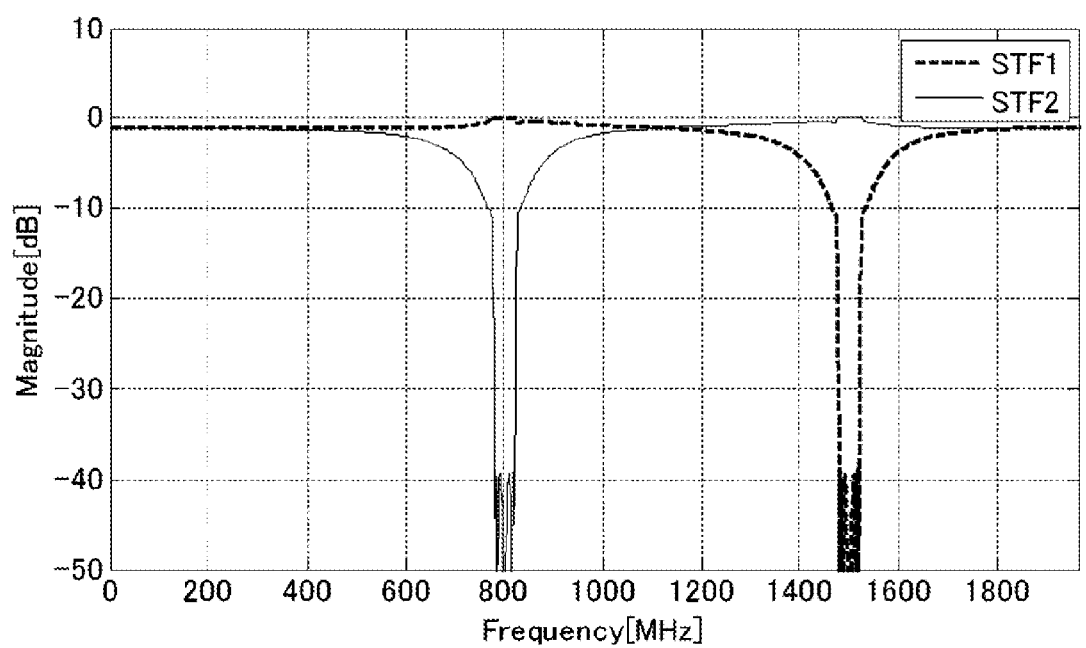
[FIG. 6]

FIG. 6 shows the first signal transfer function $STF_1(z)$ and the second signal transfer function $STF_2(z)$ in the case where the first noise transfer function $NTF_1(z)$ and the second noise transfer function $NTF_2(z)$ are set as described above.

As is apparent from FIG. 6, the first signal transfer function $STF_1(z)$ with respect to the first input signal $U_1(z)$=800 MHz hardly attenuates the signal in the band near 800 MHz (pass band), while it has a stop band (notch) near 1.5 GHz that is the frequency of the second input signal $U_2(z)$.

Further, the second signal transfer function $STF_2(z)$ with respect to the second input signal $U_2(z)$=1.5 GHz hardly attenuates the signal in the band (pass band) near 1.5 GHz, while it has a stop band (notch) near 800 MHz that is the frequency of the first input signal $U_1(z)$.

Figure 7:
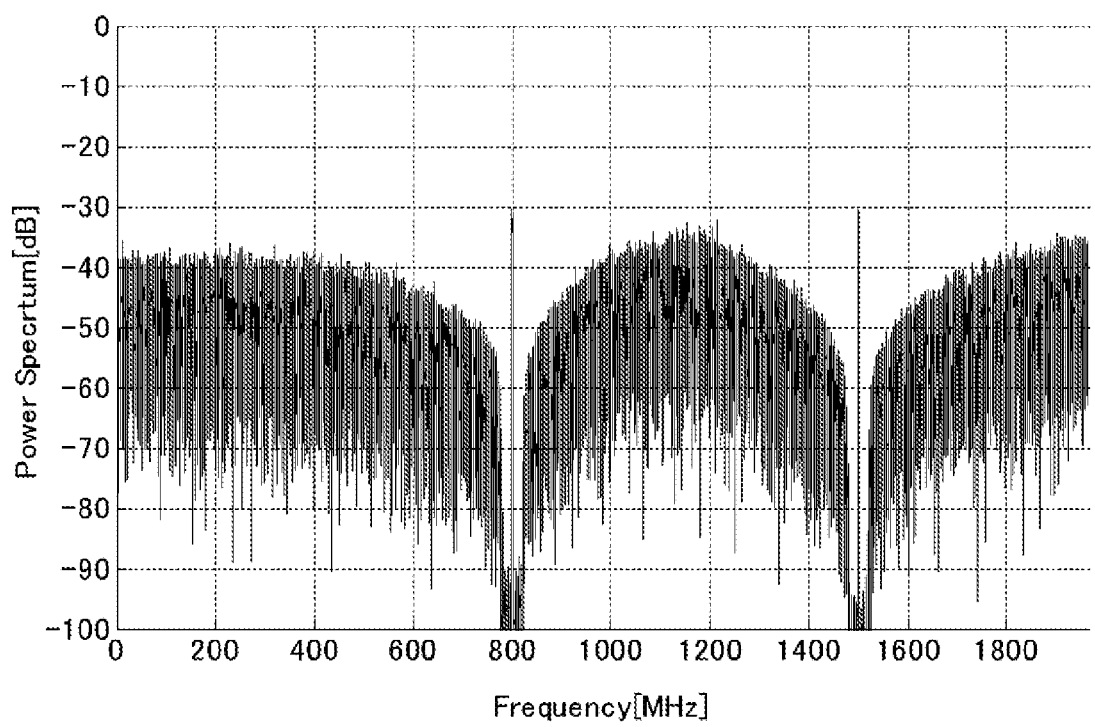
[FIG. 7]

FIG. 7 shows a power spectrum (simulated power spectrum) of the output $V(z)$ of the delta-sigma modulator 1 shown in FIG. 1. As shown in FIG. 7, a signal of 800 MHz and a signal of 1.5 GHz are outputted, and stop bands are formed near 800 MHz and near 1.5 GHz. In these stop bands, quantization noise is sufficiently suppressed.

Therefore, in the delta-sigma modulator 1 shown in FIG. 1, even when the plurality of input signals $U_1(z)$, $U_2(z)$ having different frequencies are simultaneously inputted thereto, the input signals $U_1(z)$, $U_2(z)$ do not interfere each other. Thus, the plurality of input signals $U_1(z)$, $U_2(z)$ can be included in the single output signal $V(z)$ to be outputted simultaneously.

Figure 8:
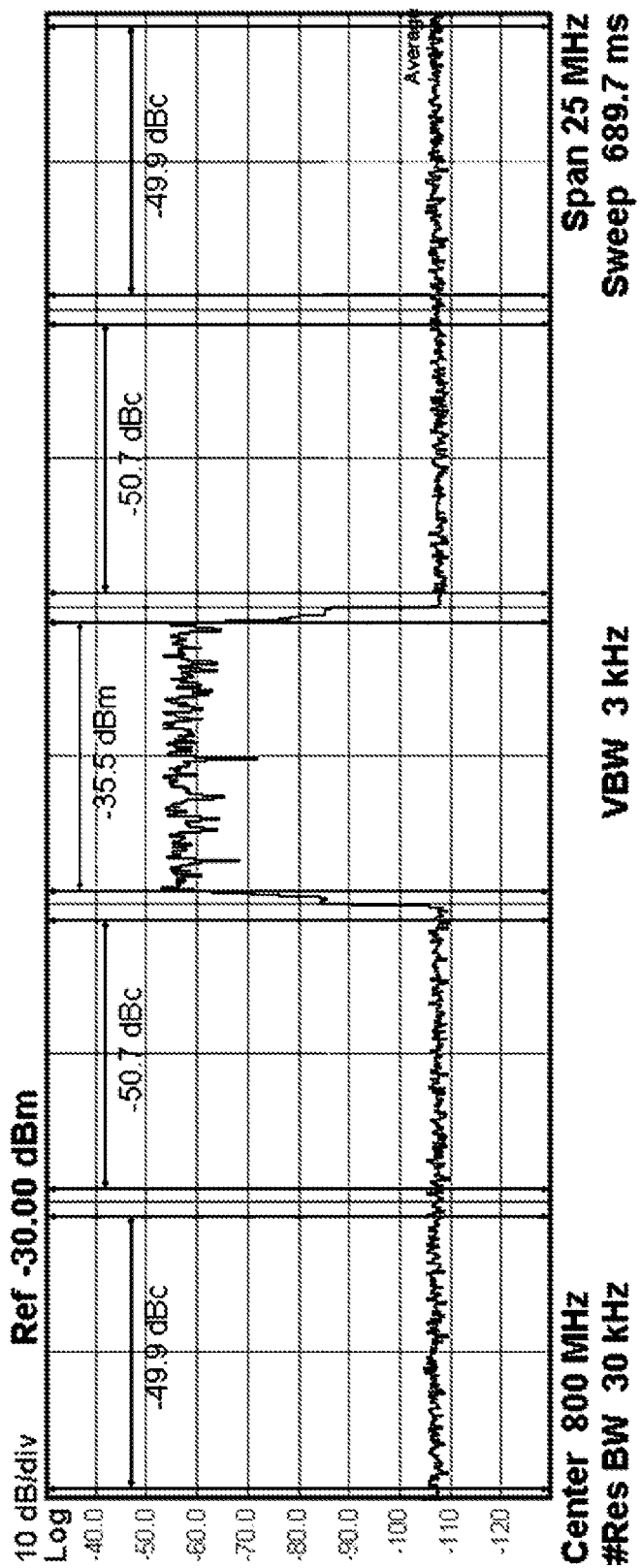
[FIG. 8]
Figure 9:
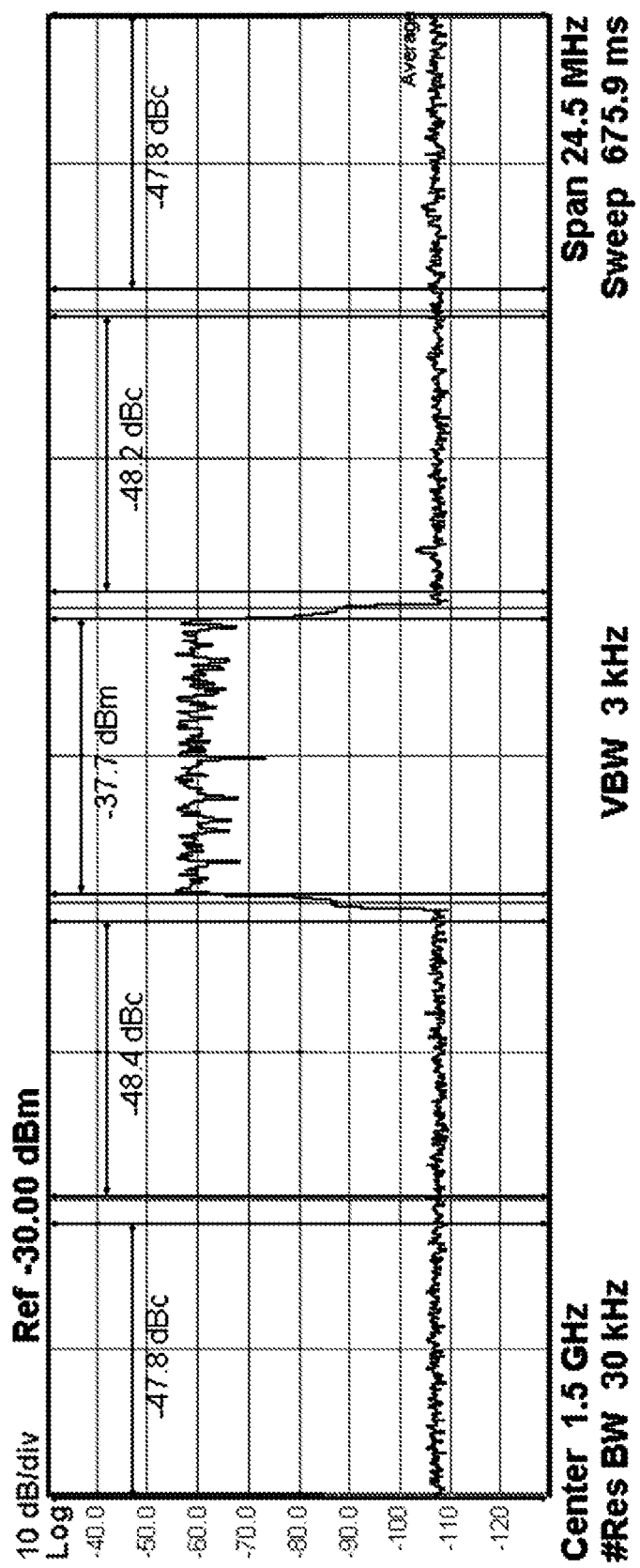
[FIG. 9]
Figure 10:
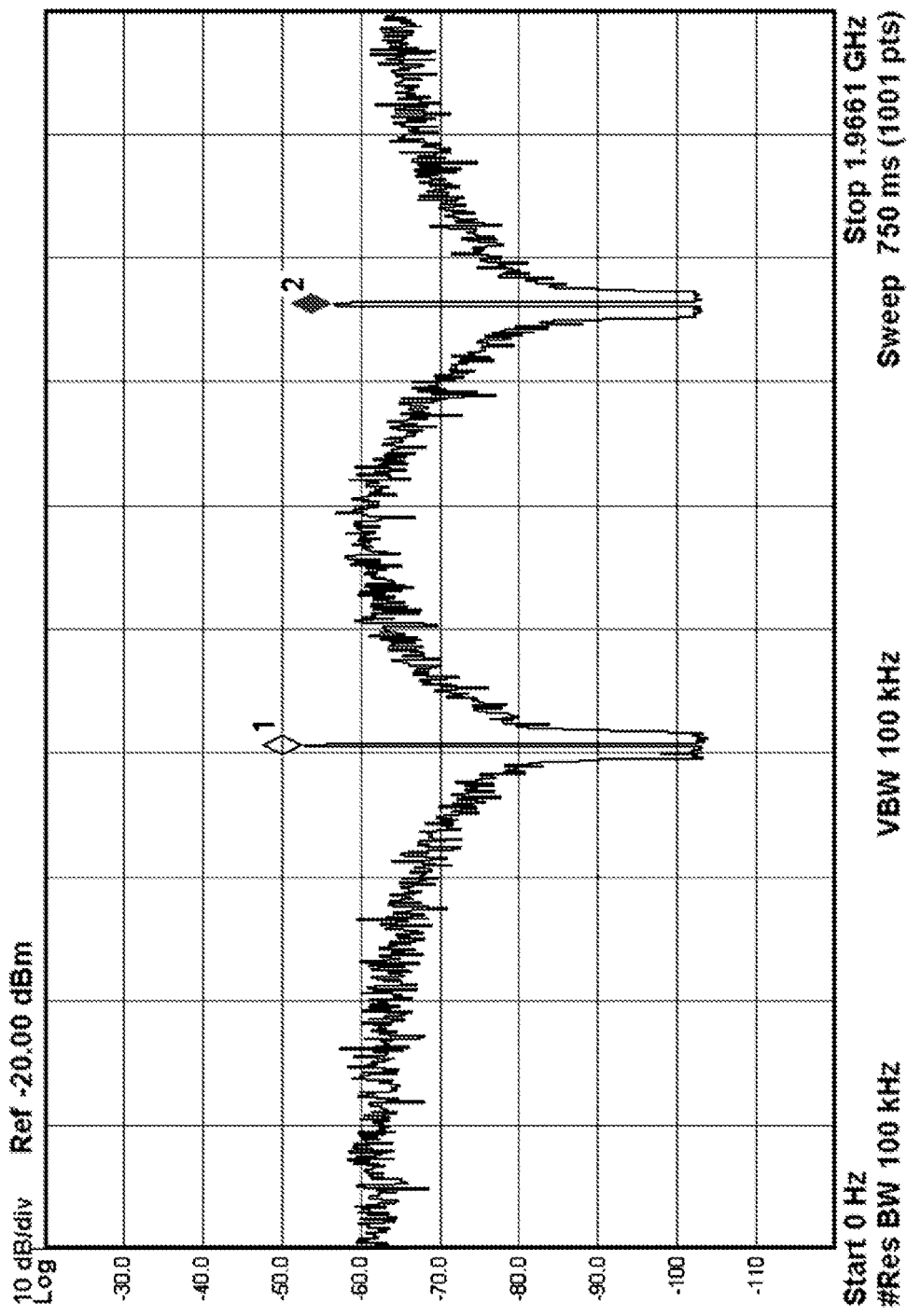
[FIG. 10]

FIGS. 8 to 10 show measurement results in the case where LTE (Long Term Evolution) signals of 800 MHz and 1.5 GHz each having a bandwidth of 5 MHz are used as the two input signals $U_1$, $U_2$ to the delta-sigma modulator 1.

FIG. 8 shows a power spectrum near 800 MHz in a 1-bit digital data stream (3.9 Gbps) that is the output V of the delta-sigma modulator 1, and it is found that the ACLR is about 50 dBm.

FIG. 9 shows a power spectrum near 1.5 GHz in the 1-bit digital data stream (3.9 Gbps) that is the output V of the delta-sigma modulator 1, and it is found that the ACLR is about 48 dBm.

FIG. 10 shows the entire image of the power spectrum of the output V of the delta-sigma modulator 1.

As is apparent from FIGS. 7 to 10, the spectrum of the output V of the delta-sigma modulator 1 shown in FIG. 1 is good as a spectrum of an RF signal.

Therefore, the delta-sigma modulator 1 shown in FIG. 1 is suitable for outputting a plurality of RF signals as a 1-bit digital data stream.

[3. Second Embodiment: Structure of Generalized Delta-sigma Modulator]

The structure of the loop filter 11, 12 of the delta-sigma modulator 1 is one example, and the loop filter 11, 12 is not limited to the structure shown in FIG. 1. Various structures that loop filters in conventional single-input single-output delta-sigma modulators can adopt may be adopted as the structure of the loop filter 11, 12 of the delta-sigma modulator 1.

Figure 11:
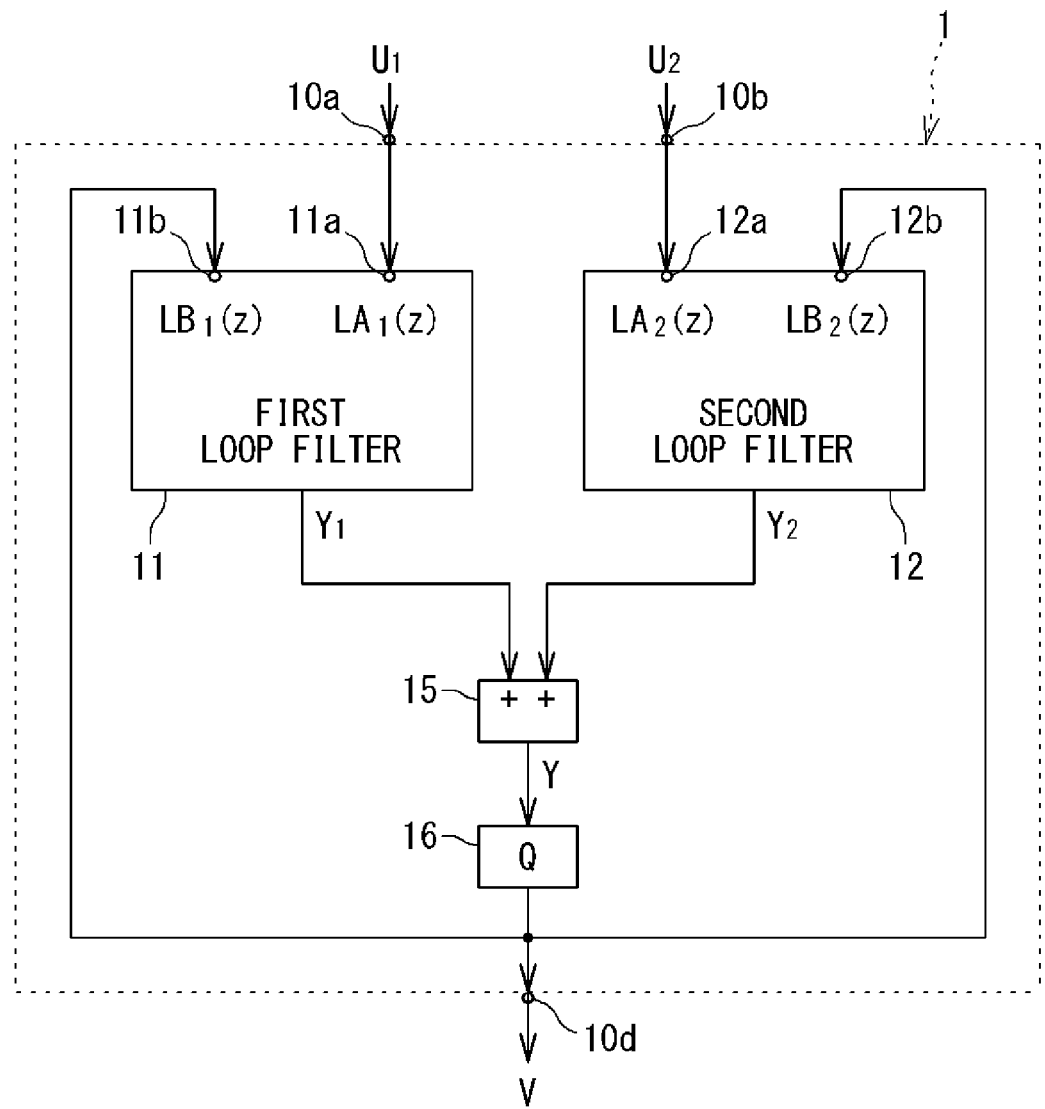
[FIG. 11]

FIG. 11 shows the delta-sigma modulator 1 with generalized loop filters 11, 12.

The characteristic of a first loop filter shown in FIG. 11 is represented by use of $LA_1(z)$, $LB_1(z)$ instead of $L1(z)$ shown in FIG. 1. The characteristic of a second loop filter shown in FIG. 11 is represented by use of $LA_2(z)$, $LB_2(z)$ instead of $L_2(z)$ shown in FIG. 1. These transfer functions $LA_1(z)$, $LB_1(z)$, $LA_2(z)$, $LB_2(z)$ will be described later.

In other respects, the delta-sigma modulator 1 shown in FIG. 11 is identical to that shown in FIG. 1.

[4. Third Embodiment: Multiband Compatible Delta-sigma Modulator]

Figure 12:
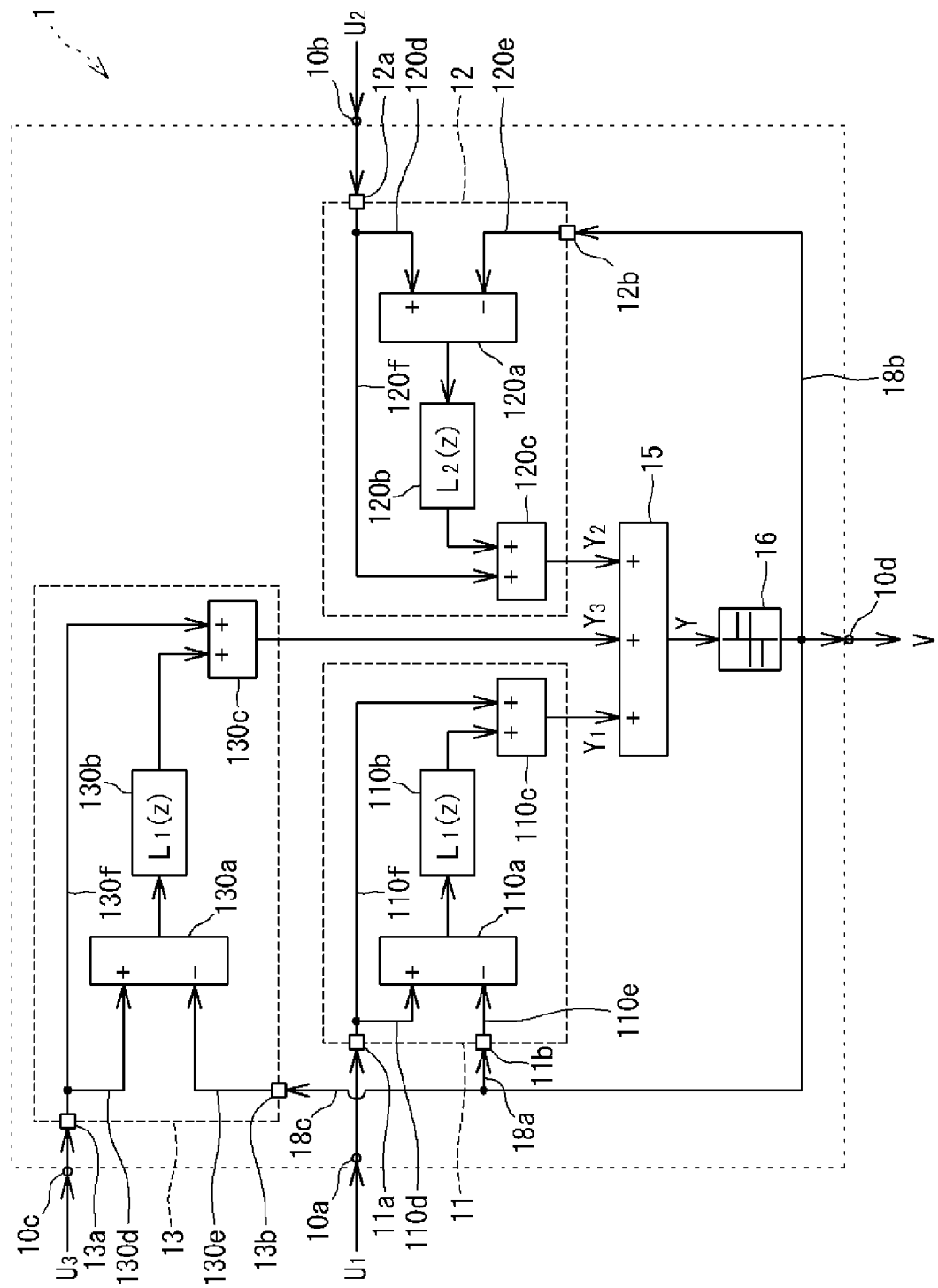
[FIG. 12]

FIG. 12 shows a multiband compatible delta-sigma modulator 1 to which input signals $U_1$, $U_2$, $U_3$ having different frequencies can be inputted.

The delta-sigma modulator 1 shown in FIG. 12 includes a third loop filter 13 corresponding to a third input signal $U_3$, in addition to a first loop filter 11 and a second loop filter 12 similar to those of the delta-sigma modulator 1 shown in FIG. 1. The third loop filter is provided corresponding to a third input port 10c to which the third input signal $U_3$ is inputted, and basically has the same structure as the first loop filter 11 and the second loop filter 12.

That is, the third loop filter 13 includes a first input section 13a connected to the third input port 10c, and a second input section 13b connected to an output side of the quantizer 16 via a third feedback path 18c.

Further, the third loop filter 13 includes a differentiator 130a, an inner filter 130b, an adder 130c, a feed forward path 130f, and the like.

The adder 15 shown in FIG. 12 adds outputs $Y_1$, $Y_2$, $Y_3$ of the three loop filters 11, 12, 13, and provides the sum to the quantizer 16.

The output V of the quantizer 16 is fed back to the second input sections 11b, 12b, 13b of the three loop filters 11, 12, 13.

The output V of the delta-sigma modulator 1 shown in FIG. 12 is expressed by the following equation (11) (when N=3 in the equation (11)). In the equation (11), $STF_i(z)$ represents an i-th signal transfer function with respect to an i-th input signal $U_i(z)$. It is noted that the number N of input signals that can be inputted to the delta-sigma modulator 1 is not limited to two or three, and may be four or more.

[Math. 11]

$$V(z)=\Sigma_{i=1}^{N}STFi(z)Ui(z)+NTF(z)E(z) \quad (11)$$

N=number of input signals
where
[Math. 12]

$$STFi(z)=\{1+Li(z)\}/\{1+\Sigma_{x=1}^{N}Lx(z)\} \quad (12)$$

[Math. 13]

$$NTF(z)=1/\{1+\Sigma_{x=1}^{N}Lx(z)\} \quad (13)$$

[Math. 14]

$$Lx(z)=(1/NTFx(z))-1 \quad (14)$$

[Math. 15]

$$NTFx(z) = \prod_{i=1}^{M} \frac{z-z_{xi}}{z-p_{xi}}, x=1 \sim N \quad (15)$$

where M is the order of the delta-sigma modulator, $z_{xi}$ is a zero, and $p_{xi}$ is a pole.

Figure 13:
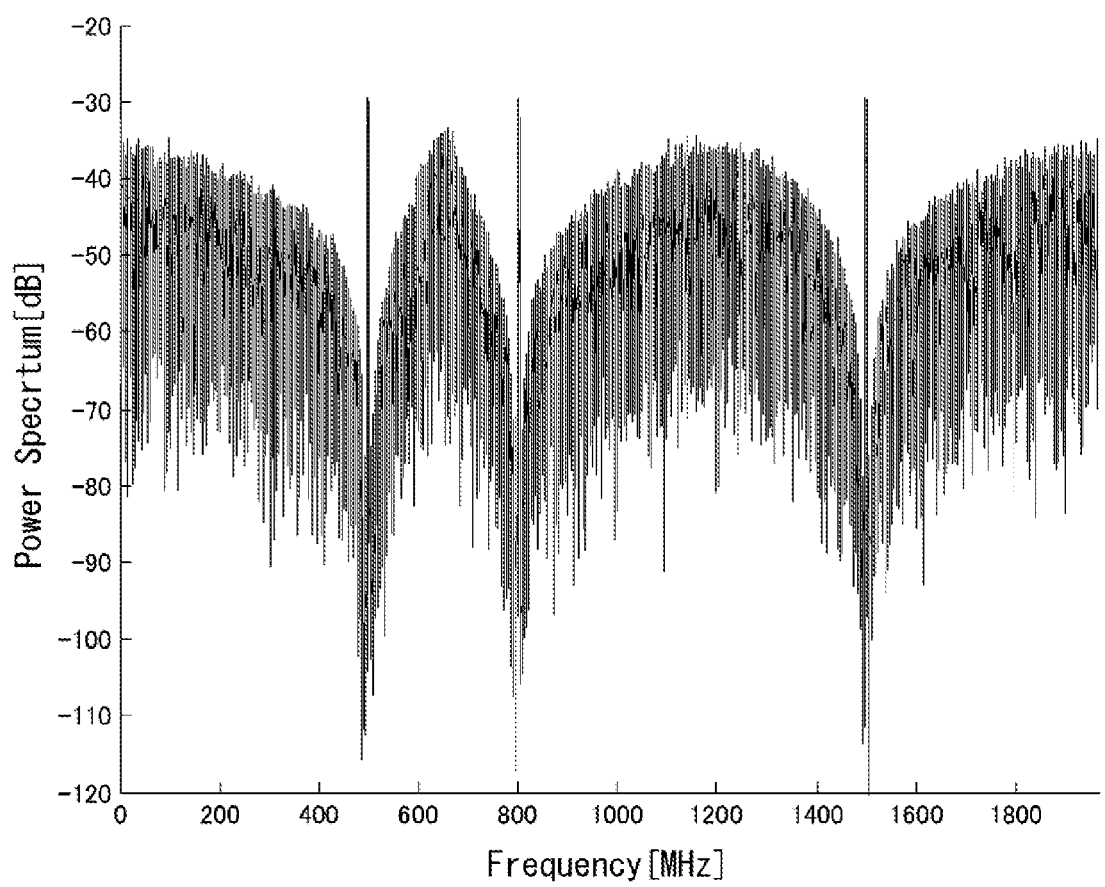
[FIG. 13]

FIG. 13 shows a power spectrum (simulated power spectrum) of the output V(z) of the delta-sigma modulator 1 in the case where LTE (Long Term Evolution) signals of 800 MHz, 1.5 GHz, and 500 MHz each having a bandwidth of 5 MHz are used as three input signals $U_1$, $U_2$, $U_3$ to the delta-sigma modulator 1.

It is noted that the first noise transfer function $NTF_1(z)$ of the first loop filter 11 is set, in response to the frequency (800 MHz) of the first input signal $U_1$, so that the center frequency of the noise stop band is about 800 MHz.

Further, the second noise transfer function $NTF_2(z)$ of the second loop filter 12 is set, in response to the frequency (1.5 GHz) of the second input signal $U_2$, so that the center frequency of the noise stop band is about 1.5 GHz.

Further, the third noise transfer function $NTF_3(z)$ of the third loop filter 13 is set, in response to the frequency (500 MHz) of the third input signal $U_3$, so that the center frequency of the noise stop band is about 500 MHz.

As shown in FIG. 13, the signal of 500 MHz, the signal of 800 MHz, and the signal of 1.5 GHz are outputted, and the stop bands are formed neat 500 MHz, near 800 MHz, and near 1.5 GHz. In these stop bands, quantization noise is sufficiently suppressed.

Thus, the favorable effect is achieved even when the number of the input signals is three.

[5. Output of Generalized Delta-sigma Modulator]

As described above, the number of the loop filters in the delta-sigma modulator 1 is not particularly limited.

Therefore, when the generalized delta-sigma modulator 1 shown in FIG. 11 is configured to have an arbitrary number of loop filters, an output of such a delta-sigma modulator 1 is expressed as follows by use of transfer functions $LA_i$, $LB_i$ of the respective loop filters. It is noted that $LA_i$, $LB_i$ represent transfer functions of the i-th loop filters 11, 12, and N represents the number of input signals (loop filters).

[Math. 16]

$$V(z) = \sum_{i=1}^{N} (LA_i(z)U_i(z) + LB_i(z)V(z)) + E(z) \tag{16}$$

$$LA_i = \frac{STF_i(z)}{NTF_i(z)} \tag{17}$$

$$LB_i = 1 - \frac{1}{NTF_i(z)} \tag{18}$$

According to the above equations, the transfer functions $LA_i$, $LB_i$ of the i-th loop filters 11, 12 can be obtained by calculation if the signal transfer function $STF_i$ and the noise transfer function $NTF_i$ desired for each of the corresponding i-th input signals are determined. Since this calculation is similar to the calculation in the loop filters of the conventional single-input single-output delta-sigma modulator, the transfer functions $LA_i$, $LB_i$ can be easily calculated.

As shown in FIG. 1, in the case where the loop filters 11, 12 are configured so that only the difference U(z)–V(z) between the input signal U(z) and the feedback signal V(z) is inputted to the inner filters 110b, 120b, and have the feed forward paths 110f, 120f, respectively, the following equations are established for the transfer functions $LA_i$, $LB_i$:

$LA_i(z)=L_i(z)+1$ $LB_i(z)=-L_i(z)$

On the other hand, when the loop filters 11, 12 shown in FIG. 1 do not include the feed forward paths 110f, 120f, the following equations are established:

$LA_i(z)=L_i(z)$ $LB_i(z)=-L_i(z)$

When the loop filters 11, 12 have the inner filters 110b, 120b to which only the difference U(z)–V(z) between the input signal U(z) and the feedback signal V(z) is inputted as described above, it is only required to determine one transfer function $L_i(z)$ for the loop filters 11, 12, and therefore, the design is facilitated.

Further, when the loop filters 11, 12 have the feed forward paths 110f, 120f as shown in FIG. 1, the input signal $U_i(z)$ to be outputted can be directly provided to the quantizer side without passing through the inner filters 110b, 120b, and therefore, the design is facilitated.

[6. Communication Device]

[6.1 First Example of Communication Device]

Figure 14:
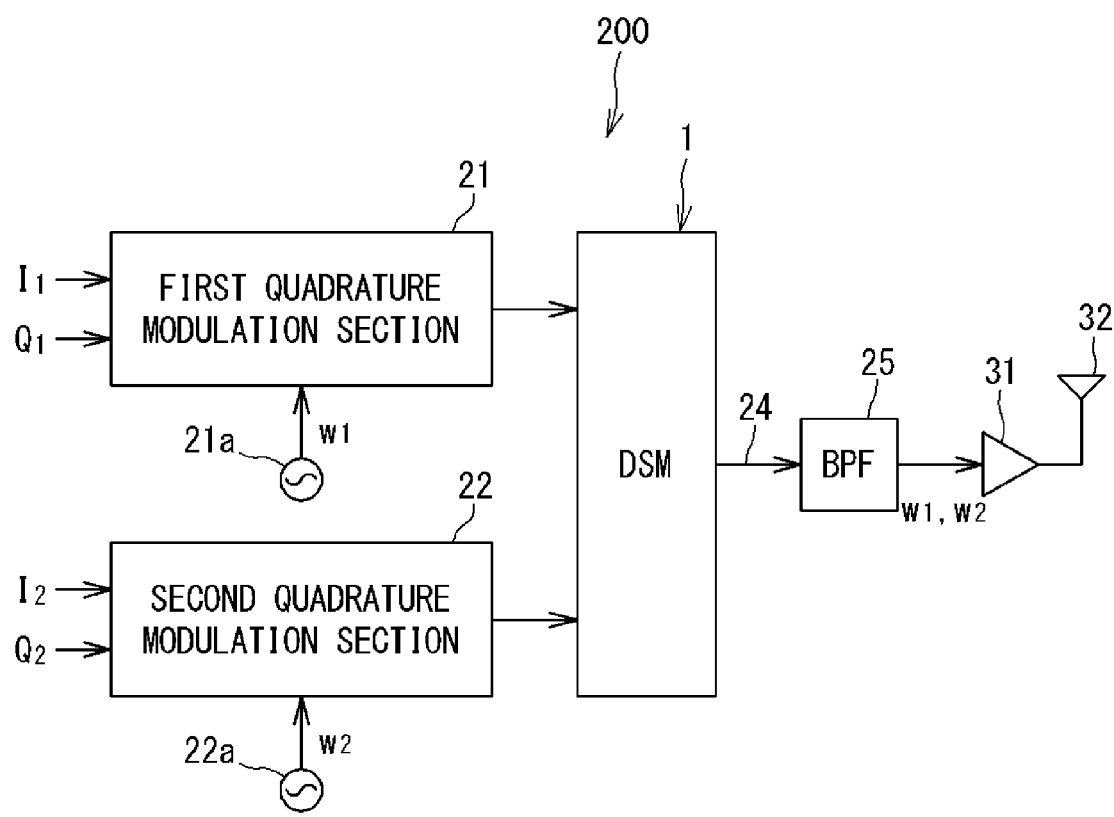
[FIG. 14]

FIG. 14 shows a first example of a communication unit (radio communication unit) 200 using the delta-sigma modulator 1 according to the above-described embodiment.

The communication unit 200 includes a plurality of quadrature modulation sections (primary modulators) 21, 22, a delta-sigma modulator (secondary modulator) 1, and a band-pass filter 25.

The plurality of quadrature modulation sections 21, 22 perform quadrature modulation as primary modulation on base-band signals $I_1$, $Q_1$, $I_2$, $Q_2$, respectively. Since local oscillators 21a, 22a for the plurality of quadrature modulation sections 21, 22 have different frequencies $w_1$, $w_2$, the quadrature modulation sections 21, 22 output radio signals (RF signals) $U_1$, $U_2$ of different frequencies, respectively.

The plurality of radio signals $U_1$, $U_2$ are input signals to the delta-sigma modulator 1.

The delta-sigma modulator 1 performs delta-sigma modulation as secondary modulation on the plurality of radio signals $U_1$, $U_2$ to output a pulse signal including the plurality of radio signals $U_1$, $U_2$. The output signal of the delta-sigma modulator 1 is provided to the band-pass filter 25 via a transmission path 24. The band-pass filter 25 has a passband that allows the plurality of radio signals $U_1$, $U_2$ to passtherethrough. The band-pass filter 25 removes noise outside the frequency bands of the plurality of radio signals $U_1$, $U_2$.

In the case where the frequencies of the plurality of radio signals $U_1$, $U_2$ are close to each other, it is sufficient to provide one band-pass filter 25 as shown in FIG. 14 even when the plurality of radio signals $U_1$, $U_2$ are outputted from the delta-sigma modulator 1.

The plurality of radio signals $U_1$, $U_2$ outputted from the band-pass filter 25 are amplified by a power amplifier 31 and outputted from an antenna 32.

The communication unit 200 is able to operate in a dual-band mode (multi-band mode) in which a plurality of radio signals of different frequencies are simultaneously outputted.

Further, since the output of the delta-sigma modulator 1 is a digital signal, the radio signals can be transmitted as a digital signal to a distant place through a high-speed transmission path 24 such as an optical fiber.

Further, since the plurality of radio signals can be included in one digital data stream, the plurality of radio signals can be transmitted through the single transmission path 24.

[6.2 Second Example of Communication Device]

Figure 15:
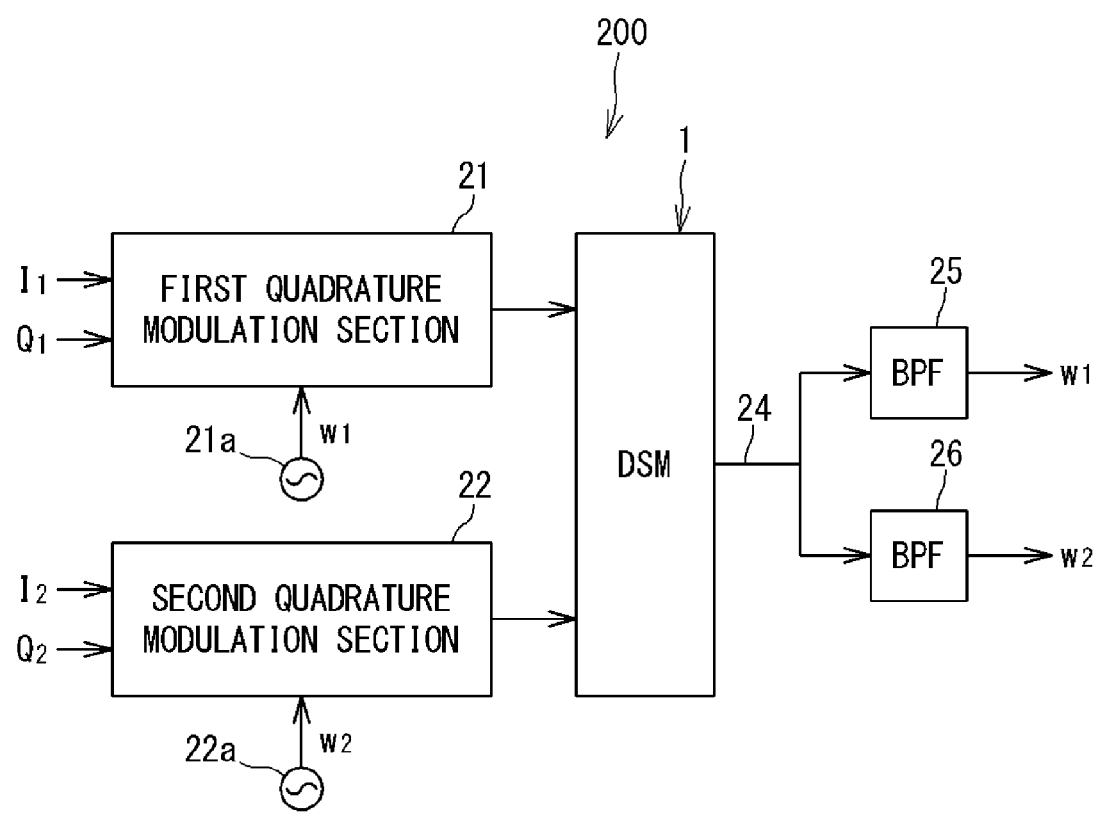
[FIG. 15]

FIG. 15 shows a second example of the communication unit (radio communication unit) 200 using the delta-sigma modulator 1 according to the above-described embodiment.

In the communication unit 200 according to the second example, a plurality of (two) band-pass filters 25, 26 are provided corresponding to the number of the radio signals $U_1$, $U_2$. The output of the delta-sigma modulator 1 is provided to each of the plurality of band-pass filters 25, 26 through the transmission path 24.

When the frequencies of the plurality of radio signals $U_1$, $U_2$ are apart from each other, noise outside the frequency bands of the radio signals $U_1$, $U_2$ can be appropriately removed by using the plurality of band-pass filters 25, 26 having the passbands corresponding to the frequencies of the respective radio signals $U_1$, $U_2$.

In other respects, the communication unit 200 shown in FIG. 15 is identical to that shown in FIG. 14. In FIG. 15, the circuits subsequent to the band-pass filters 25, 26 are omitted.

[6.3 Third Example of Communication Device]

Figure 16:
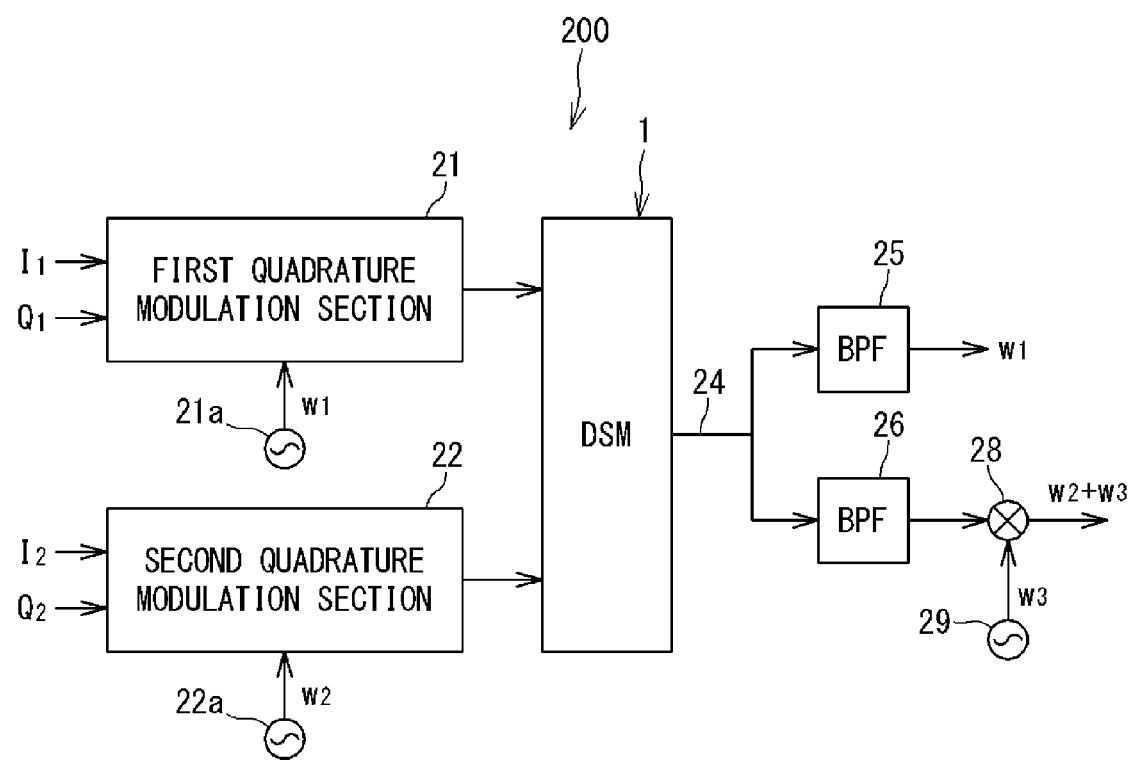
[FIG. 16]

FIG. 16 shows a third example of the communication unit (radio communication unit) 200 using the delta-sigma modulator 1 according to the above-described embodiment.

The communication unit 200 according to the third example is obtained by providing a frequency mixer (frequency converter) 28 on the output side of the band-pass filter 26 of the communication unit 200 according to the second example. In other respects, the communication unit 200 of the third example is identical to that of the second example.

In the third example, a signal (frequency w1) outputted from the first quadrature modulation section 21 is a radio frequency signal (RF signal), and a signal (frequency w2) outputted from the second quadrature modulation section 22 is an intermediate frequency signal (IF signal) having a relatively low frequency.

In the third example, the IF signal outputted from the band-pass filter 26 is subjected to frequency conversion by the frequency mixer 28 to be converted to an RF signal of w2+w3 (w3: the frequency of a local oscillator 29).

By performing the frequency conversion at the output side of the delta-sigma modulator 1 with the frequency of the input signal to the delta-sigma modulator 1 being reduced, the operating frequency (sampling frequency) of the delta-sigma modulator 1 can be reduced.

Although, in FIG. 16, only one of the plurality of input signals is the IF signal, both the input signals may be IF signals.

[6.4 Fourth Example of Communication Device]

Figure 17:
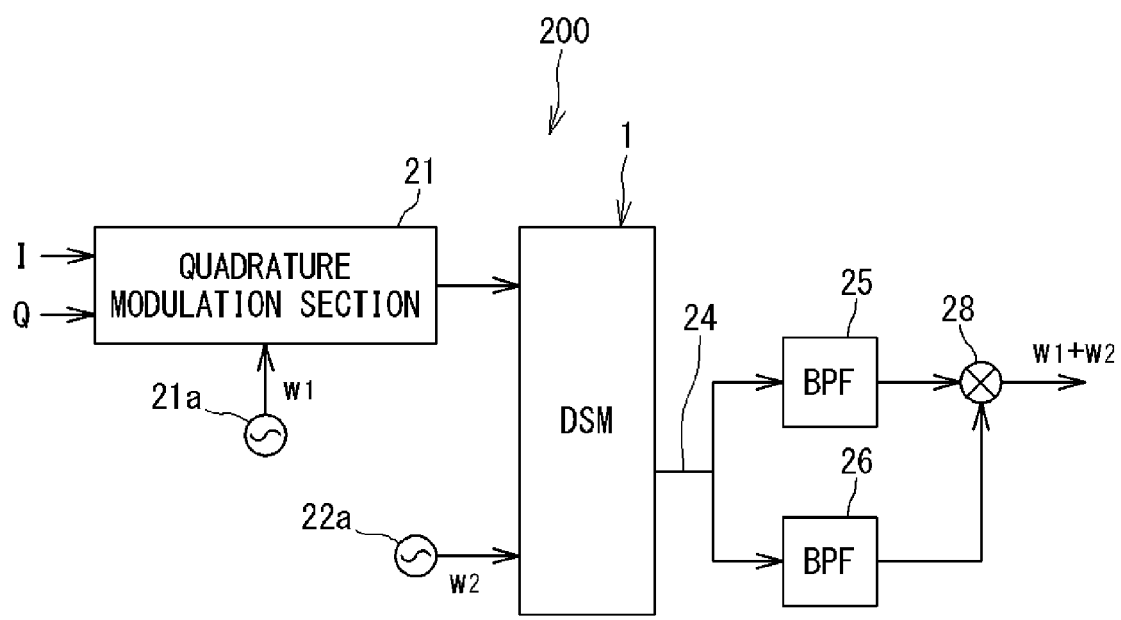
[FIG. 17]

FIG. 17 shows a fourth example of the communication unit (radio communication unit) 200 using the delta-sigma modulator 1 according to the above-described embodiment.

In the fourth example, the output signal (IF signal; frequency w1) of the quadrature modulation section 21 is inputted to one of the input ports of the delta-sigma modulator 1, while a local signal (local oscillation signal; frequency w2) for frequency conversion is inputted to the other input port.

The delta-sigma modulator 1 according to the fourth example outputs a digital signal including the IF signal of the frequency w1 and the local signal of the frequency w2.

These signals are subjected to noise removal by the band-pass filters 25, 26, and thereafter, inputted to the frequency mixer (frequency converter) 28. The frequency mixer 28 converts the IF signal of the frequency w1 to an RF signal of a frequency w1+w2.

In the communication unit 200 according to the fourth example, since not the RF signal but the IF signal is inputted to the delta-sigma modulator 1, the operating frequency (sampling frequency) of the delta-sigma modulator 1 can be reduced.

Moreover, since the local signal for frequency conversion is also included in the output of the delta-sigma modulator 1 which is a digital signal, an analog circuit subsequent to the BPFs 25, 26 need not include a local oscillator, and thus the configuration can be simplified.

[6.5 Fifth Example of Communication Device]

Figure 18:
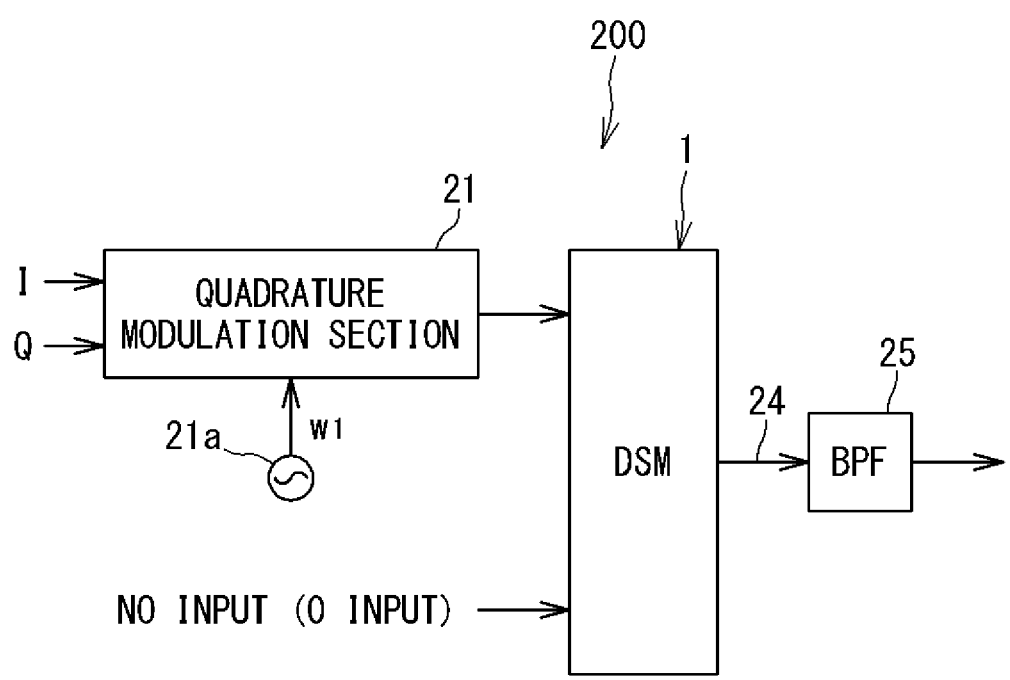
[FIG. 18]

FIG. 18 shows a fifth example of the communication unit (radio communication unit) 200 using the delta-sigma modulator 1 according to the above-described embodiment.

In the fifth example, while the output signal (frequency w1) of the quadrature modulation section 21 is inputted to one of the input ports of the delta-sigma modulator 1, nothing is inputted to the other input port.

Of the two loop filters 11, 12 of the delta-sigma modulator 1, the loop filter corresponding to the input port to which the output signal of the quadrature modulation section 21 is inputted is set so that the center frequency of the noise stop band is the frequency w1 of the output signal.

On the other hand, the loop filter corresponding to the input port having no input is set so that the center frequency of the noise stop band is near zero frequency (high-pass filter).

Figure 19:
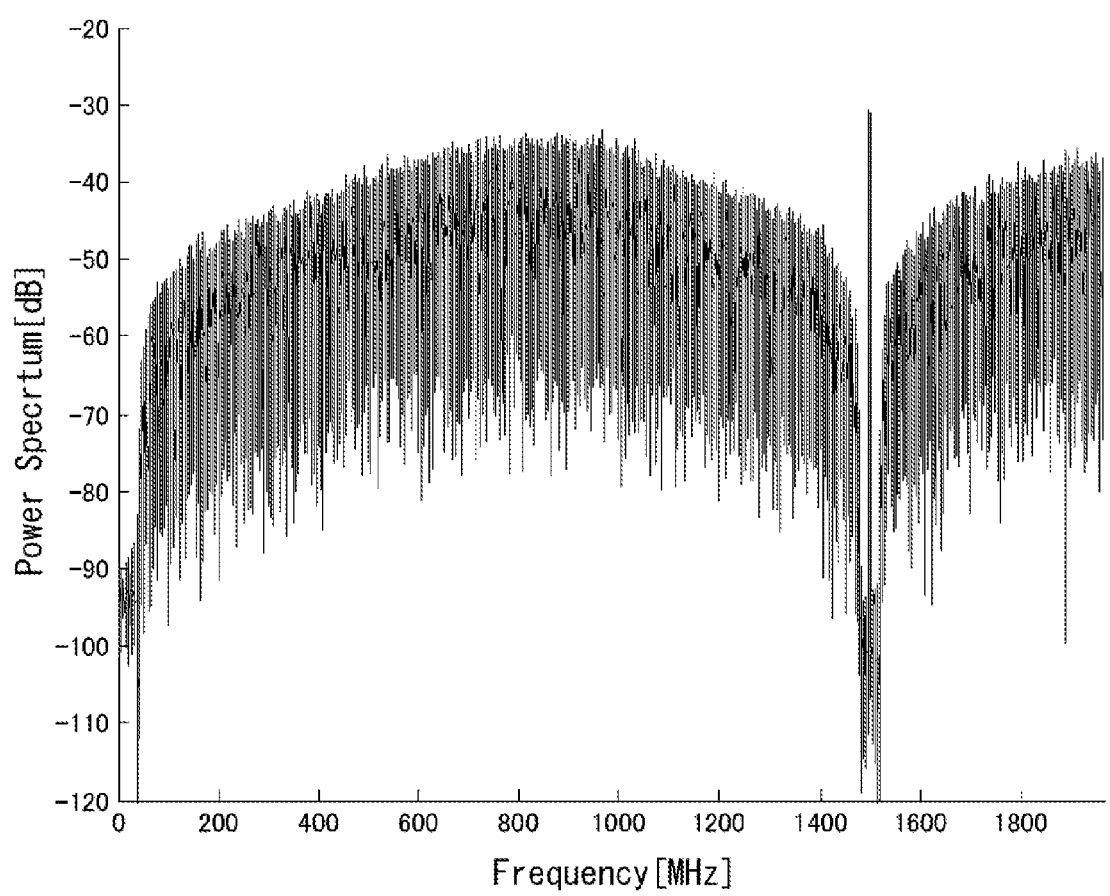
[FIG. 19]

FIG. 19 shows a power spectrum of the output of the delta-sigma modulator 1 in the case where the frequency w1 of the output signal of the quadrature modulation section 21 is 1.5 GHz in FIG. 18.

As is apparent from FIG. 19, while the signal of 1.5 GHz is included in the output of the delta-sigma modulator 1, no signal is present at zero frequency. However, noise is suppressed at frequencies near both 1.5 GHz and 0 Hz.

As described above, according to the fifth example, the delta-sigma modulator 1 can output an output signal including a signal of a specific frequency, and having less DC component (signal of zero frequency).

By reducing the DC component in the output signal of the delta-sigma modulator 1, the run length can be reduced.

Figure 20:
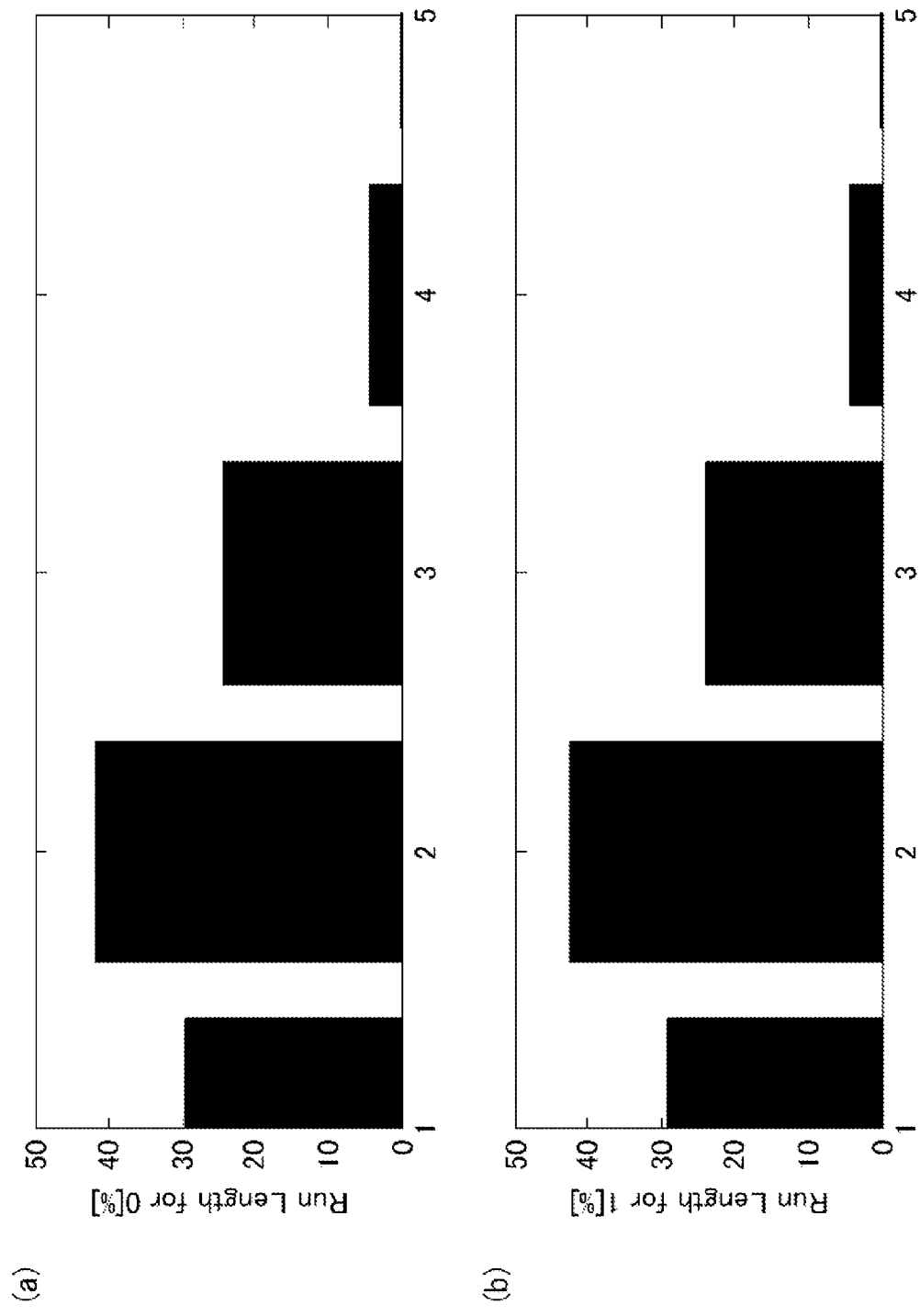
[FIG. 20]

In other words, as shown in FIG. 20, the number of continuous 0 s (refer to FIG. 20(a)) or 1 s (refer to FIG. 20(b)) in the pulse signal is reduced to about 2 to 4, which means that the run length is reduced.

When the run length is reduced, strain of the pulse signal can be suppressed. Therefore, in the fifth example, strain of the output signal (pulse signal) of the delta-sigma modulator 1 can be suppressed.

While a signal having less signal and less noise is obtained near the zero frequency in the fifth example, a signal having less signal and less noise can be obtained near a desired frequency by setting the center frequency of the noise stop band of the loop filter having no input, to the desired frequency.

[7. Additional Notes]

The embodiments disclosed are to be considered in all respects as illustrative and not restrictive. The scope of the invention is indicated by the appended claims rather than by the foregoing meaning, and all changes which come within the meaning and range of equivalency of the claims are therefore intended to be embraced therein.

REFERENCE SIGNS LIST 1 delta-sigma modulator
10a, 10b, 10c input port
10d output port
11 first loop filter
110a differentiator (adder)
110b inner filter (filter)
110c adder
110f feed forward path
12 second loop filter
120a differentiator (adder)

120*b* inner filter (filter)
120*c* adder
120*f* feed forward path
13 third loop filter
130*b* inner filter (filter)
130*c* adder
130*f* feed forward path
15 adder
16 quantizer
18*a*, 18*b*, 18*c* feedback path

The invention claimed is:

1. A delta-sigma modulator comprising:
a plurality of input ports to which a plurality of input signals having different frequencies are inputted, respectively;
a plurality of loop filters provided corresponding to the plurality of input ports, respectively;
an adder configured to add outputs of the plurality of loop filters; and
a quantizer configured to quantize an output of the adder, wherein
the plurality of loop filters are each provided to receive the input signal inputted to the corresponding input port and a feedback signal of an output of the quantizer, and
the plurality of loop filters each have a characteristic of stopping noise in the vicinity of a frequency of the input signal inputted to the corresponding input port.

2. The delta-sigma modulator according to claim 1, wherein
the plurality of loop filters each include:
a differentiator configured to calculate a difference between the input signal inputted to the corresponding input port and the feedback signal of the output of the quantizer; and
an inner filter to which an output of the differentiator is inputted.

3. The delta-sigma modulator according to claim 2, wherein
the plurality of loop filters are each further provided with a feed forward path configured to add the input signal inputted to the corresponding input port, to an output of the inner filter.

4. A communication device comprising:
the delta-sigma modulator according to claim 1; and
one or a plurality of band-pass filters through which an output signal outputted from the quantizer of the delta-sigma modulator passes, wherein
the one or the plurality of band-pass filters have passbands which allows the plurality of input signals to the delta-sigma modulator to pass the band-pass filters.

5. The communication device according to claim 4 further including:
a frequency mixer to which the plurality of input signals having passed through the one or the plurality of band-pass filters are inputted, wherein
the plurality of input signals to the delta-sigma modulator include a local signal used for frequency conversion by the frequency mixer.

* * * * *